United States Patent
Stockinger et al.

(10) Patent No.: US 8,274,146 B2
(45) Date of Patent: Sep. 25, 2012

(54) HIGH FREQUENCY INTERCONNECT PAD STRUCTURE

(75) Inventors: Michael A. Stockinger, Austin, TX (US); Kevin J. Hess, Round Rock, TX (US); James W. Miller, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/130,579

(22) Filed: May 30, 2008

(65) Prior Publication Data
US 2009/0294970 A1 Dec. 3, 2009

(51) Int. Cl.
*H01L 23/12* (2006.01)
(52) U.S. Cl. ........ 257/700; 257/750; 257/762; 257/773; 257/774; 438/761
(58) Field of Classification Search ............... 257/750, 257/762, 773, 774, E23.003, E23.01, E23.011, 257/700; 438/761, FOR. 211, FOR. 349, 438/FOR. 354–FOR. 355
See application file for complete search history.

(56) References Cited

U.S. PATENT DOCUMENTS

| | | | |
|---|---|---|---|
| 5,612,230 A * | 3/1997 | Yuzurihara et al. | 438/164 |
| 6,614,091 B1 | 9/2003 | Downey et al. | |
| 6,770,554 B1 * | 8/2004 | Welstand | 438/618 |
| 6,998,712 B2 * | 2/2006 | Okada et al. | 257/758 |
| 7,160,795 B2 | 1/2007 | Batra et al. | |
| 7,241,636 B2 | 7/2007 | Hess et al. | |
| 7,358,531 B2 * | 4/2008 | Koyama | 257/59 |
| 2003/0222295 A1 * | 12/2003 | Lin | 257/300 |
| 2006/0065969 A1 * | 3/2006 | Antol et al. | 257/700 |
| 2007/0069388 A1 * | 3/2007 | Kunishima et al. | 257/773 |

OTHER PUBLICATIONS

Ker, Ming-Dou et al.; Fully Process-Compatible Layout Design on Bond Pad to Improve Wire Bond Reliability in CMOS ICs; IEEE Transactions on Components and Packaging Technolgies; Jun. 2002; pp. 309-316; vol. 25, No. 2; IEEE.
Ker, Ming-Dou et al.; "Design on the Low-Capacitance Bond Pad for High-Frequency I/O Circuits in CMOS Technology"; IEEE Transactions on Electron Devices; Dec. 2001; vol. 48, No. 12; IEEE.

* cited by examiner

*Primary Examiner* — Jae Lee
(74) *Attorney, Agent, or Firm* — Joanna G. Chiu; James L. Clingan, Jr.

(57) ABSTRACT

An integrated circuit includes a high speed circuit, an interconnect pad, a passivation layer under the interconnect pad, a first patterned metal layer, and a first via. The high speed circuit is for a high speed signal at a terminal of the high speed circuit. The interconnect pad is on a top surface of the integrated circuit structure. The first patterned metal layer is under the passivation layer having a first portion and a second portion. The first portion of the first patterned metal layer is connected to the terminal of the high speed circuit. The second portion of the first patterned metal layer is under the interconnect pad and is electrically floating when the high frequency signal is present on the interconnect pad portion. The result is reduced capacitive loading on the high speed signal which improves performance.

10 Claims, 2 Drawing Sheets

HIGH FREQUENCY INTERCONNECT PAD STRUCTURE

BACKGROUND

1. Field

This disclosure relates generally to interconnect pads, and more specifically, to high frequency interconnect pad structures.

2. Related Art

High-speed analog and radio frequency (RF) input/output (I/O) interconnect pads for integrated circuits require low parasitic capacitance associated with the interconnect pad structure. Furthermore, an interconnect pad needs a certain minimum size in order to facilitate formation of an external interconnect (e.g. a bump or a wire bond) on the interconnect pad. However, the interconnect pad and underlying stack of metal layers usually cause an undesirable parasitic capacitance, which can negatively impact performance of high frequency circuits.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, as will be described herein, a last interconnect metal layer of an integrated circuit may include a pattern of one or more electrically floating portions located under an interconnect pad. This may help reduce parasitic capacitance, which may be particularly problematic when the interconnect pad is used for high frequency or high speed applications. Furthermore, in one embodiment, additional interconnect metal layers, under the last interconnect metal layer, also include patterns of one or more electrically floating portions under the interconnect pad, misaligned with respect to the pattern in the last interconnect metal layer, to possibly further reduce parasitic capacitance. In one embodiment, the last interconnect metal layer includes copper or an alloy containing copper, where portions of this layer which are exposed by vias or openings of an overlying passivation layer and are capped by a capping layer. This capping layer may include any number of interconnect pads, and may include aluminum or an alloy containing aluminum. In one embodiment, a portion of an underlying passivation layer is located between each of the interconnect pads and the last interconnect metal layer, such that an external connection made to the interconnect pad (e.g. a contact probe, wirebond, solder bump, etc.) is formed over the underlying passivation layer. Furthermore, in one embodiment, portions of the capping layer are exposed by openings in an overlying passivation layer overlying the capping layer which may also be referred to as a final passivation layer or second passivation layer. Therefore, in one embodiment, for those interconnect pads used to transmit high frequency or high speed signals, one or more electrically floating metal portions are located in the last interconnect metal layer, directly under the interconnect pad.

Figure 1:
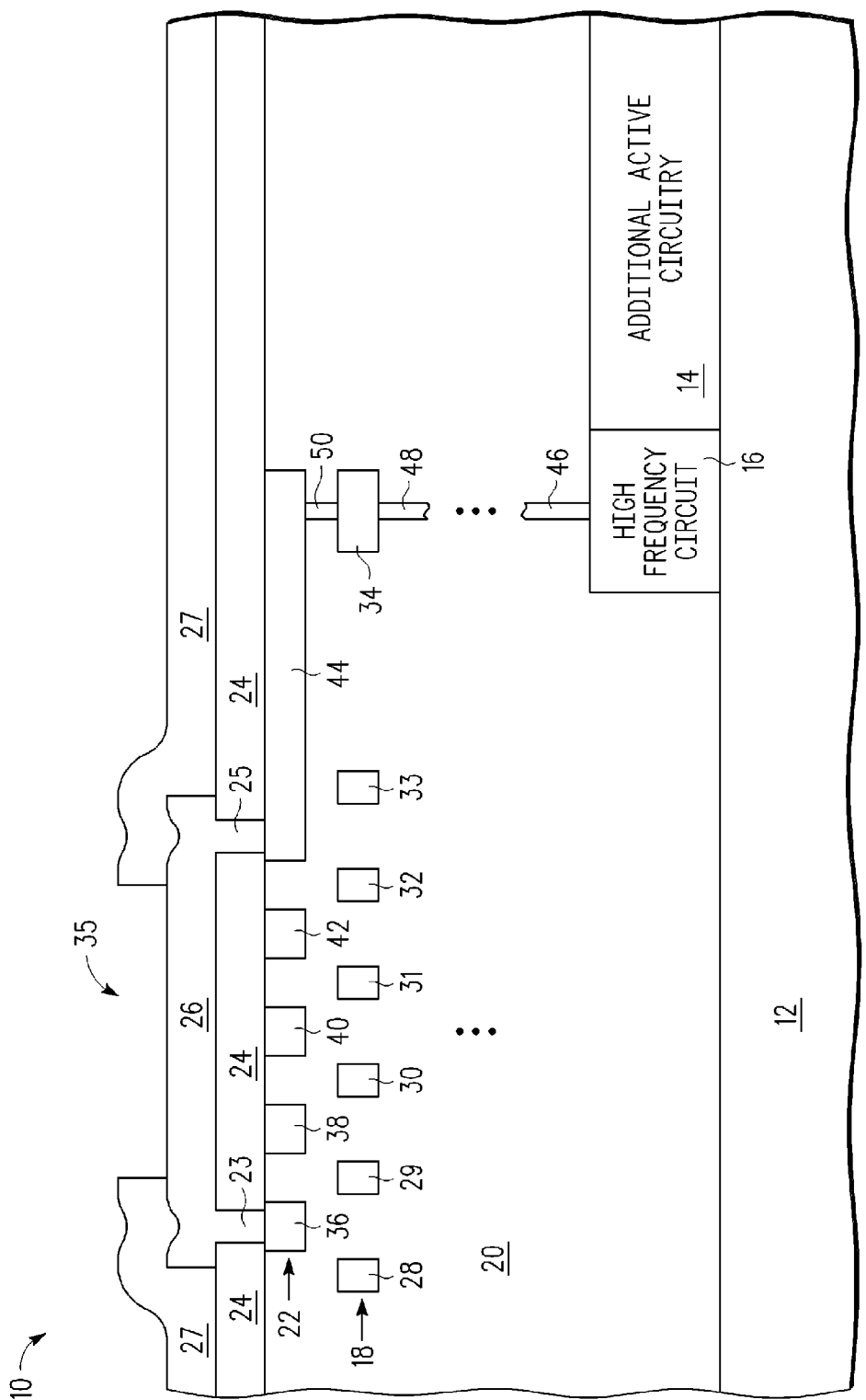
FIG. 1 illustrates a cross-sectional view of an integrated circuit having an interconnect pad, an underlying last metal layer, and an overlying passivation layer in accordance with one embodiment of the present invention.

Illustrated in FIG. 1 is a cross-section of an integrated circuit 10. Integrated circuit 10 has an interconnect pad 26 with underlying, electrically floating, metal layers, functional metal interconnect layers, and active circuitry. By way of example, integrated circuit 10 includes a high frequency circuit 16 and additional active circuitry 14, both of which are formed, as known in the art, on and in a semiconductor substrate 12. Semiconductor substrate 12 can be any semiconductor material or combinations of materials, such as gallium arsenide, silicon germanium, silicon-on-insulator (SOI), silicon, monocrystalline silicon, the like, and combinations of the above. Integrated circuit 10 includes a plurality of interconnect layers to form connections from active circuitry on and in substrate 12 to interconnect pads and to form connections between portions of active circuitry on and in substrate 12. The interconnect layers include a top or last interconnect metal layer (Mtop) 22 which may also be referred to as a first patterned metal layer and an Mtop-1 layer 18, underlying Mtop layer 22, which may also be referred to as a second patterned metal layer. Mtop layer 22 includes high frequency signal interconnect portions 36 and 44, and floating portions 38, 40, and 42. Mtop-1 layer 18 includes floating portions 28, 29, 30, 31, 32, and 33, and signal interconnect portion 34. The interconnect layers may include any number of additional interconnect layers, as needed, to route signals. Integrated circuit 10 also includes an insulator 20 which surrounds the metal portions and conductive vias of the interconnect layers. Note that insulator 20 may be formed with multiple layers including one or more insulating materials and deposited and patterned in many steps, as known in the art.

Integrated circuit 10 includes a passivation layer 24 overlying Mtop layer 22. Integrated circuit 10 also includes an interconnect pad 26 (which, in some embodiments, may also be referred to as an interconnect bond pad), most of which lies over passivation layer 24. Passivation layer 24 includes openings which allow conductive vias, such as vias 23 and 25, to pass through passivation layer 24 to electrically connect interconnect pad 26 to portions 36 and 44, respectively, of Mtop layer 22. Although only vias 23 and 25 are illustrated in FIG. 1, any number of vias in any configuration may be present through passivation 24 to provide electrical connections between interconnect pad 26 and Mtop layer 22. Note that a portion of passivation layer 24 lies between interconnect pad 26 and portions of the last metal layer (Mtop layer 22). Also, note that passivation layer 24 may also be referred to as an underlying passivation layer or a first passivation layer. In one embodiment, at least the portion of passivation layer 24 between interconnect pad 26 and Mtop layer 22, has a thickness in a range of 300 nanometers (nm) to 1000 nm, or, more preferably, 550 nm to 900 nm, or, even more preferably, 600 nm to 750 nm. In one embodiment, the thickness is approximately 640 nm. Note that interconnect pad 26 may be used to provide external connections to integrated circuit 10. Various different means may be used to electrically connect the interconnect pads, such as interconnect pad 26, of integrated circuit 10 to a package structure. For example, a wirebond connection can be made by bonding a conductive wire to interconnect pad 26, such as ball bonding a gold wire to interconnect pad 26. In another example, a flip chip connection can be made by forming a conductive bump on interconnect pad 26, an example of which is a eutectic tin/lead alloy ball attached to interconnect pad 26. In another example, electrical connection can be made by forming a conductive metal column on interconnect pad 26, an example of which is a plated copper pillar. In yet another example, conductive metal vias disposed in a dielectric layer can be used to electrically connect interconnect pads, such as interconnect pad 26, to a conductive wire that redistributes the signal to another electrical connection point. For example, this conductive redistribution wire may connect to an interconnect pad of a second die in a multiple die module, such as a redistributed chip package. In yet another example, a nonpermanent electrical connection can be made by contacting interconnect pad 26 with a conductive wire, such as a cantilever probe needle. Therefore, interconnect pad 26 may be used in providing an electrical connection external to integrated circuit 10 in a variety of different ways. Also, in one embodiment, a barrier layer (not shown) may be used as necessary between interconnect pad 26 and portions 36 and 44 of Mtop layer 22. Also, in another embodiment, a barrier layer may additionally be used between interconnect pad 26 and passivation layer 24.

Interconnect pad 26 may be formed from aluminum and Mtop layer 22 may be formed of copper. Also, Mtop-1 layer 18 and any additional interconnect layers may also be formed of copper. However, one skilled in the art will recognize that interconnect pad 26 may be an alloy containing aluminum and any of the interconnect layers (such as, for example, Mtop layer 22 and Mtop-1 layer 18) may be an alloy containing copper. In yet another embodiment, interconnect pad 26 may be formed of a first metal or an alloy containing the first metal, and Mtop layer 22 may be formed of a second metal, different from the first metal, or an alloy containing the second metal. In one embodiment, interconnect pad 26 is formed of aluminum and has a thickness in a range of 300 nm to 2500 nm, or, more preferably, 700 nm to 2200 nm, or, even more preferably, 1000 nm to 2000 nm. In one embodiment, the thickness is approximately 1800 nm. In one embodiment, interconnect pad 26 is a portion of a capping layer used to cap exposed regions of Mtop layer 22 (such as portions of portions 36 and 44 which are exposed by passivation layer 24), and thus may protect these exposed portions of Mtop layer 22. Therefore, the capping layer may be used to form any number of interconnect pads, such as interconnect pad 26, as needed. In one embodiment, the capping layer does not operate as an interconnect layer. Also, in the case where the capping layer is formed of aluminum or an alloy containing aluminum, the capping layer allows for the use of the same tools and processes used in aluminum interconnect technologies.

Still referring to FIG. 1, integrated circuit 10 includes a passivation layer 27 overlying passivation layer 24 and portions of interconnect pad 26. Passivation layer 27 includes openings, such as passivation opening 35, which expose interconnect pad 26. Although only passivation opening 35 is illustrated in FIG. 1, any number of openings in any configuration may be present through passivation layer 27 to expose interconnect pad 26 and any other interconnect pads of integrated circuit 10. Note that passivation layer 27 may also be referred to as an overlying passivation layer, a final passivation layer, or a second passivation layer. Passivation layer 27 may be formed with multiple materials and deposited and patterned in many steps, as known in the art. In an alternate embodiment, passivation layer 27 may not be present. In this case, passivation layer 24 may be referred to as the final passivation layer, where a portion of this final passivation layer underlies interconnect pad 26.

Still referring to FIG. 1, interconnect pad 26 is connected to a terminal of high frequency circuit 16. For example, high frequency circuit 16 transmits and/or receives high frequency signals to/from interconnect pad 26 by way of high frequency signal interconnect portion 44, conductive via 50, interconnect portion 34, conductive via 48, and conductive via 46. Note that the interconnect portions and conductive vias located in the additional interconnect layers (represented by the ellipsis) are not shown, but may be routed as known in the art. Furthermore, note that additional interconnect portions may be present within the illustrated portion of integrated circuit 10, but, for simplicity of explanation, are not shown. High frequency circuit 16 and interconnect pad 26 may be used for a variety of different types of high frequency applications. High frequency circuit 16 may include any type of devices and circuitry, as needed, to implement desired functions of the high frequency applications, and may also be referred to as a high speed circuit. In one embodiment, such as in RF applications, a high frequency signal refers to a signal having a frequency of 10 GHz or more. In one embodiment, such as in a high speed interface application, a high frequency signal refers to a signal having a data rate of 1 or more gigabits per second.

In one embodiment, interconnect portion 36 is routed to an electrostatic discharge (ESD) circuit. Alternatively, ESD protection circuitry may be located within high frequency circuit 16 or additional active circuitry 14. Note that, as illustrated in FIG. 1, high frequency circuit 16 and additional active circuitry 14 are not formed directly under interconnect pad 26, but are offset from interconnect pad 26. However, alternatively, active circuitry (such as high frequency circuit 16, additional active circuitry 14, or any other active circuitry, or combinations thereof) may also be located directly under interconnect pad 26.

In high frequency applications, reduction of parasitic capacitance may help improve performance. Therefore, in one embodiment, a pattern of one or more electrically floating metal portions in Mtop layer 22 are placed under passivation layer 24 and interconnect pad 26, as illustrated in FIG. 1. In one embodiment, when a portion of an interconnect layer is electrically floating, it is electrically isolated from other conductive components. For example, this can be achieved by surrounding the electrically floating portions with an insulator, such as insulator 20 and passivation layer 24. As illustrated in FIG. 1, Mtop layer 22 includes floating portions 38, 40, and 42, which may also be referred to as electrically isolated portions. In one embodiment, since portions 38, 40, and 42, which are directly under interconnect pad 26, are electrically isolated, the parasitic capacitance between interconnect pad 26 and any non-floating interconnect layers (not shown) and substrate 12 in a region of integrated circuit 10 directly under interconnect 26 is reduced. For example, the parasitic capacitance may be reduced because the effective dielectric thickness is increased. In one embodiment, no other metal, other than electrically floating portions, are located in Mtop layer 22 between the conductive vias 23 and 25, under interconnect pad 26. That is, in one embodiment, directly under interconnect pad 26, between conductive vias 23 and 25, no non-floating metal is present in Mtop layer 22. In another embodiment, Mtop layer 22 and/or Mtop-1 layer 18 may also contain small conductive portions (not shown in FIG. 1) that connect to power supplies or electrical signals other than the high-frequency signal from interconnect pad 26. In one embodiment, this may allow for a more convenient routing path under interconnect pad 26 as compared to routing around interconnect pad 26. In this embodiment, the combined width of such additional interconnect portions would be small compared to the size of interconnect pad 26 and would therefore not add significant parasitic coupling capacitance to interconnect pad 26.

Figure 2:
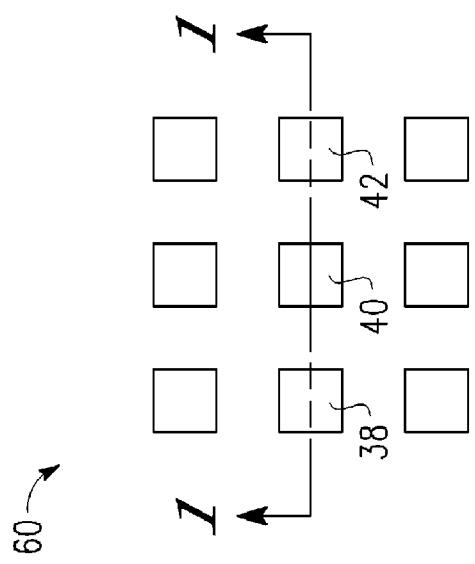
FIG. 2 illustrates a top down view of a portion of a last metal layer in accordance with one embodiment of the present invention.

A variety of different patterns may be used to form the pattern of one or more electrically floating metal portions. In one embodiment, the electrically floating metal portions of Mtop layer 22 under interconnect pad 26 have a metal density of 50 percent or less, or, more preferably, of 25 percent or less. In one embodiment, the metal density is approximately 20 percent. FIG. 2 illustrates a top down view of a floating pattern 60, which is a part of Mtop layer 22 and which includes a grid of separate floating metal portions, including floating portions 38, 40, and 42. That is, pattern 60 can be described as including a plurality of islands, where each of portions 38, 40, and 42 can be considered an island. Note that pattern 60 can include any shape floating metal portions or any arrangement or configuration of islands. In one embodiment, the floating metal portions may be positioned such that they form an alternating, or staggered, arrangement. In one embodiment, the metal density of pattern 60 is designed to achieve a value sufficient to adhere to chemical-mechanical polishing (CMP) requirements. Alternatively, such as in the case of using interconnect pad 26 as a wire bond pad, the metal density may be sufficient to provide structural support to receive the wire bond (which may be a metal density greater than that which is sufficient to adhere to CMP requirements).

Figure 3:
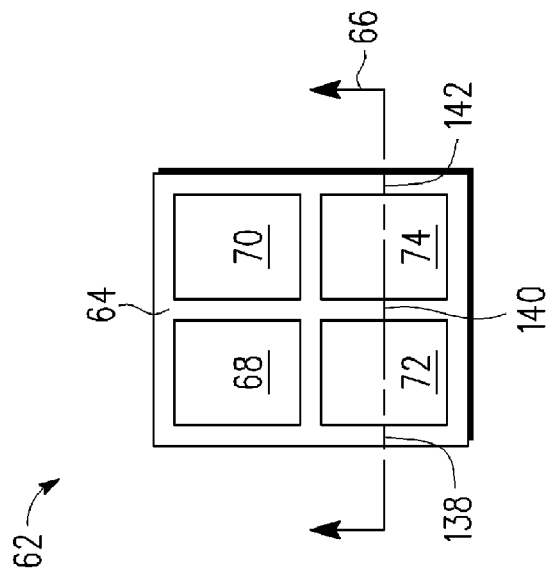
FIG. 3 illustrates a top down view of a portion of a last metal layer in accordance with one embodiment of the present invention.

FIG. 3 illustrates a pattern 62 which may be used as an electrically floating metal portion of Mtop layer 22 directly under interconnect pad 26. Pattern 62 includes a continuous grid structure 64 with openings 68, 70, 72, and 74. If a cross-section were taken through line 66, then regions 138, 140, and 142 are analogous to floating portions 38, 40, and 42. However, regions 138, 140, and 142 are part of a single electrically floating structure. Pattern 62 may be described as a continuous metal layer in a mesh pattern, and can have any number of conductive rows and columns. Note that pattern 62 can include any shape of openings in any arrangement or configuration. In one embodiment, the openings in the pattern 62 are positioned such that they form an alternating, or staggered, arrangement. In one embodiment, the metal density of pattern 62 is designed to achieve a value sufficient to adhere to chemical-mechanical polishing (CMP) requirements. Alternatively, such as in the case of using interconnect pad 26 as a wirebond pad, the metal density may be sufficient to provide structural support to receive the wire bond (with may be a metal density greater than that which is sufficient to adhere to CMP requirements).

Therefore, note that in one embodiment, Mtop layer 22 can be described as having a first portion and a second portion, where the first portion (e.g. portion 44) is connected to the terminal of a high speed circuit (e.g. high frequency circuit 16) and the second portion is under an interconnect pad (e.g. portions 38, 40, and 42 under interconnect pad 26) and is electrically floating at least when a high frequency signal is present on the interconnect pad. In one embodiment, the first portion is any portion of Mtop layer 22 which is not electrically floating and may also be referred to as the active portion. In one embodiment, the second portion (i.e. the floating portion) remains floating when the high frequency signal is present on the active portion.

The second portion which is located under an interconnect pad can have any pattern of one or more electrically floating portions. For example, the second portion can include a pattern of alternating metal segments having spaces therebetween (where the alternating metal segments can be separate portions such as in FIG. 2 or segments of a continuous structure such as in FIG. 3). Referring back to FIG. 1, integrated circuit 10 includes Mtop-1 layer 18, under Mtop layer 22, which may also include a pattern of one or more electrically floating metal portions under interconnect pad 26. Such as with Mtop layer 22, any pattern may be used under interconnect pad 26 for Mtop-1 layer 18, such as those patterns described above in reference to FIGS. 2 and 3. In one embodiment, the pattern of Mtop-1 layer 18 under interconnect pad 26 is misaligned with respect to the pattern of Mtop layer 22 under interconnect pad 26. In this manner, Mtop-1 layer 18 may have metal segments aligned to the spaces between the metal segments of Mtop layer 22, as illustrated, for example, in FIG. 1, where portions 28-32 are misaligned with respect to portions 36-42. Furthermore, the pattern of Mtop-1 layer 18 may be different from the pattern of Mtop layer 22 under interconnect pad 26, and may include more or less metal segments than Mtop layer 22. Furthermore, the metal densities described above for the electrically floating metal portions for Mtop layer 22 may also apply to Mtop-1 layer 18; however the metal densities of the floating portions of Mtop layer 22 may be different from that of Mtop-1 layer 18. The misalignment of the patterns of Mtop layer 22 and Mtop-1 layer 18 may further help to reduce parasitic capacitance. In one embodiment, one or more additional interconnect layers under layers 18 and 22 may also include a pattern of one or more floating metal portions under interconnect pad 26.

By now it should be appreciated that, in one embodiment, by using the last interconnect metal layer to provide for a pattern of one or more electrically floating portions under an interconnect pad, parasitic capacitance may be reduced, particularly when the interconnect pad is used for high frequency or high speed applications. Furthermore, the use of additional interconnect layers, under the last interconnect layer, which also include patterns of one or more electrically floating portions under the interconnect pad may further reduce parasitic capacitance.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.
Additional Text:
1. An integrated circuit structure for example: (10), comprising:
   a high speed circuit for example: (16) for a high speed signal at a terminal of the high speed circuit;
   an interconnect pad for example: (26) over the integrated circuit structure;
   a first passivation layer for example: (24) under the interconnect pad;
   a first patterned metal layer for example: (22) under the first passivation layer having a first portion for example: (44) and a second portion for example: (36, 38, 40, 42), and
   a first via for example: (25) through the first passivation layer that connects the interconnect pad to the first portion of the first patterned metal layer;
   wherein:
   the first portion of the first patterned metal layer is connected to the terminal for example: (46) of the high speed circuit; and
   the second portion of the first patterned metal layer is under the interconnect pad and is electrically floating when the high speed signal is present on the interconnect pad.
2. The integrated circuit structure of item 1, further comprising:
   a second via for example: (23) through the first passivation layer that connects the interconnect pad to the first portion of the first patterned metal layer.
3. The integrated circuit structure of item 2, wherein the second portion of the first patterned metal layer is between the first for example: (25) and second for example: (23) via.
4. The integrated circuit structure of item 3, wherein no metal other than the second portion of the first patterned metal layer is between the first and second via.
5. The integrated circuit structure of item 1, wherein the interconnect pad is a portion of a capping layer and the first patterned metal layer is a last interconnect layer.
6. The integrated circuit structure of item 5, wherein the capping layer comprises aluminum and the last interconnect layer comprises copper.
7. The integrated circuit structure of item 1, wherein the second portion of the first patterned layer comprises a plurality of islands for example: (38, 40, 42).
8. The integrated circuit structure of item 1, further comprising a second passivation layer having a portion over a portion of the interconnect pad for example: (26).
9. The integrated circuit structure of item 1, wherein the second portion of the first patterned metal layer comprises a pattern for example: (60) of alternating metal segments for example: (38, 40, 42) under the interconnect pad having spaces therebetween, further comprising:
   a second patterned metal layer, under the first patterned metal layer having alternating metal segments aligned to the spaces between the alternating metal segments of the first patterned metal layer.
10. The integrated circuit structure of item 9, wherein the first and second patterned metal layer comprise copper.
11. An integrated circuit structure for example: (10) comprising:
    a last metal interconnect layer for example: (22) of the integrated circuit structure having an active portion for example: (36, 44) and a floating portion for example: (36, 38, 40);
    a passivation layer for example: (24) over the last metal interconnect layer for example: (22);
    a capping layer for example: (26) over the passivation layer comprising an interconnect pad for example: (26) overlying the floating portion and the active portion of the last metal interconnect layer;
    a via for example: (25) through the passivation layer connected to the active portion and the interconnect pad; and
    a high frequency circuit for example: (16) having a terminal for example: (46) for a high frequency signal, wherein the terminal is connected to the active portion, wherein the floating portion remains floating when the high frequency signal is present on the active portion.
12. The integrated circuit structure of item 11, wherein the floating portion is completely surrounded by insulating material for example: (20, 24).
13. The integrated circuit structure of item 12, wherein the floating portion has a first pattern having spaces, further comprising a next to last patterned metal layer having a second pattern for example: (28-32) having metal segments aligned to the spaces of the first pattern.
14. The integrated circuit structure of item 11, wherein the capping layer comprises aluminum.
15. The integrated circuit structure of item 11, wherein the last metal interconnect layer comprises copper.
16. The integrated circuit structure of item 11 wherein only the floating portion and the active portion comprise metal of the last metal interconnect layer under the interconnect pad.
17. The integrated circuit structure of item 11, wherein a metal density of the last metal interconnect layer under the interconnect pad is less than 25 percent
18. The integrated circuit structure of item 11, wherein the passivation layer comprises nitride.
19. An integrated circuit structure for example: (10), comprising:
    a last metal interconnect layer for example: (22) of the integrated circuit structure having an active portion for example: (36, 44) and a floating portion for example: (36, 38, 40, 42);
    a passivation layer for example: (24) over the last metal interconnect layer for example: (22);
    a capping layer for example: (26) over the passivation layer comprising an interconnect pad for example: (26) overlying the floating portion and the active portion of the last metal interconnect layer;
    a first via for example: (25) through the passivation layer connected to the active portion and the interconnect pad;
    a second via for example: (23) through the passivation layer connected to the active portion and the interconnect pad, wherein the floating portion is between the first and second via; and
    a high frequency circuit for example: (16) having a terminal for example: (46) for a high frequency signal, wherein the terminal is connected to the active portion, wherein the floating portion remains floating when the high frequency signal is present on the active portion.
20. The integrated circuit structure of item 19, wherein the capping layer comprises aluminum and the last metal interconnect layer comprises copper with a metal density between the first and second vias of less than 25 percent.

What is claimed is:
1. An integrated circuit structure comprising:
   a last metal interconnect layer of the integrated circuit structure having an active portion and a floating portion;
   a passivation layer over the last metal interconnect layer;
   a capping layer over the passivation layer comprising an interconnect bond pad overlying the floating portion and the active portion of the last metal interconnect layer, wherein the floating portion is directly under a region of the interconnect bond pad that is capable of receiving a permanent electrical connection;

a via through the passivation layer connected to the active portion and the interconnect bond pad; and a high frequency circuit having a terminal for a high frequency signal, wherein the terminal is connected to the active portion, wherein the floating portion remains floating when the high frequency signal is present on the active portion, and wherein the floating portion has a first pattern having metal segments and spaces therebetween; and a next to last patterned metal layer having a second pattern directly under the region of the interconnect bond pad, the second pattern having floating metal segments aligned to the spaces of the first pattern such that the floating metal segments of the second pattern are located directly under the spaces of the first pattern, and wherein the placement of the metal segments of the second pattered is defined by the spaces of the first pattern so that the first and second patterns are misaligned.

2. The integrated circuit structure of claim 1, wherein the capping layer comprises aluminum.

3. The integrated circuit structure of claim 1, wherein the last metal interconnect layer comprises copper.

4. The integrated circuit structure of claim 1 wherein only the floating portion and the active portion comprise metal of the last metal interconnect layer under the interconnect bond pad.

5. The integrated circuit structure of claim 1, wherein a metal density of the last metal interconnect layer under the interconnect bond pad is less than 25 percent.

6. The integrated circuit structure of claim 1, wherein the passivation layer comprises nitride.

7. The integrated circuit structure of claim 1, further comprising:

a second via through the passivation layer that connects the interconnect bond pad to the active portion.

8. The integrated circuit structure of claim 7, wherein the floating portion is between the first and second via.

9. The integrated circuit structure of claim 8, wherein no metal of the last metal interconnect layer other than the floating portion is between the first and second via.

10. The integrated circuit structure of claim 1, wherein the permanent electrical connection comprises an electrical connection selected from a group consisting of a wirebond, a conductive bump, a conductive metal column, and a conductive metal via.

* * * * *